(12) United States Patent
Ando

(10) Patent No.: US 10,620,747 B2
(45) Date of Patent: Apr. 14, 2020

(54) TOUCH TYPE OPERATION INPUT DEVICE

(71) Applicant: MURATA MANUFACTURING CO., LTD., Nagaokakyo-shi, Kyoto-fu (JP)

(72) Inventor: Masamichi Ando, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/303,661

(22) Filed: Jun. 13, 2014

(65) Prior Publication Data
US 2014/0292699 A1 Oct. 2, 2014

Related U.S. Application Data

(63) Continuation of application No. PCT/JP2012/081879, filed on Dec. 10, 2012.

(30) Foreign Application Priority Data

Dec. 16, 2011 (JP) ................ 2011-275146

(51) Int. Cl.
  *G06F 3/041* (2006.01)
  *H03K 17/96* (2006.01)
  *G06F 3/044* (2006.01)

(52) U.S. Cl.
  CPC .......... *G06F 3/0418* (2013.01); *G06F 3/044* (2013.01); *G06F 3/0414* (2013.01); *H03K 17/9643* (2013.01); *G06F 2203/04105* (2013.01)

(58) Field of Classification Search
  CPC .......... G06F 3/04; G06F 3/041; G06F 3/0418; G06F 3/0414; G06F 3/044; H03K 17/9643
  See application file for complete search history.

(56) References Cited

U.S. PATENT DOCUMENTS 8,145,298 B2    3/2012   Wu et al.
8,593,420 B1 *  11/2013  Buuck ............... G06F 3/041
                                              345/173
(Continued)

FOREIGN PATENT DOCUMENTS

CN       1659533 A    8/2005
CN     101515202 A    8/2009
(Continued)

OTHER PUBLICATIONS

PCT/JP2012/081879 ISR dated Mar. 5, 2013.
PCT/JP2012/081879 Written Opinion dated Mar. 5, 2013.

*Primary Examiner* — Vijay Shankar
*Assistant Examiner* — Cory A Almeida
(74) *Attorney, Agent, or Firm* — Arent Fox LLP

(57) ABSTRACT

A touch type operation input device capable of accurately detecting pressing force with which an operator presses is provided. The touch type operation input device includes a touch panel including a piezoelectric sensor and a touch sensor, and a pressing force detection unit. Until the pressing force detection unit detects a position detection signal given by the touch sensor, the pressing force detection unit causes a reference voltage of the pressing force detection to follow an output voltage of the piezoelectric sensor to be the same as the output voltage of the piezoelectric sensor. When the pressing force detection unit obtains the position detection signal given by the touch sensor, the pressing force detection unit fixes the reference voltage. The pressing force detection unit calculates a pressing force detection voltage from the difference between the output voltage and the fixed reference voltage, and detects the pressing force.

7 Claims, 8 Drawing Sheets

(56) References Cited

U.S. PATENT DOCUMENTS

| | | |
|---|---|---|
| 2003/0210235 A1 | 11/2003 | Roberts |
| 2006/0293864 A1* | 12/2006 | Soss .................... G06F 3/0414 |
| | | 702/104 |
| 2008/0150905 A1* | 6/2008 | Grivna ................... G06F 3/016 |
| | | 345/173 |
| 2008/0202824 A1* | 8/2008 | Philipp .................... G06F 3/02 |
| | | 178/18.01 |
| 2009/0027353 A1 | 1/2009 | Im et al. |
| 2009/0105553 A1 | 4/2009 | Wu et al. |
| 2009/0207147 A1* | 8/2009 | Perrot et al. ................. 345/173 |
| 2010/0182266 A1 | 7/2010 | Tanabe |
| 2011/0187674 A1* | 8/2011 | Baker ...................... G01L 1/10 |
| | | 345/174 |
| 2012/0075226 A1 | 3/2012 | Andoh |
| 2012/0162114 A1* | 6/2012 | Inoue ..................... G06F 3/016 |
| | | 345/173 |
| 2012/0274599 A1* | 11/2012 | Schediwy .................... 345/174 |
| 2013/0027339 A1 | 1/2013 | Kodani et al. |

FOREIGN PATENT DOCUMENTS

| | | |
|---|---|---|
| JP | 5-061592 | 3/1993 |
| JP | 08-212005 | 8/1996 |
| JP | 09-160719 | 6/1997 |
| JP | 2005-524914 A | 8/2005 |
| JP | 2005-275632 A | 10/2005 |
| JP | 2011048847 A | 3/2011 |
| JP | 2011-221721 A | 11/2011 |
| TW | 200739399 A | 10/2007 |
| TW | 200919280 A | 5/2009 |
| WO | WO-2010-143528 A1 | 12/2010 |

\* cited by examiner

TOUCH TYPE OPERATION INPUT DEVICE

CROSS REFERENCE TO RELATED APPLICATIONS

The present application is a continuation of International application No. PCT/JP2012/081879, filed Dec. 10, 2012, which claims priority to Japanese Patent Application No. 2011-275146, filed Dec. 16, 2011, the entire contents of each of which are incorporated herein by reference.

FIELD OF THE INVENTION

The present invention relates to a touch type operation input device configured to detect a position where operation/input is given with a finger and detect the amount of depression during the operation.

BACKGROUND OF THE INVENTION

In the past, various kinds of touch type operation input devices have been devised, which detect the touch position and the amount of depression during the touch when an operator touches an operation surface in a flat shape with a finger.

For example, Patent Literature 1 describes a touch type operation input device having a structure in which a flat panel shaped pressure-sensitive sensor and a touch panel for detecting the touch position are in close contact with each other in an overlapping manner. In this touch input device, the touch position is detected by the touch panel. The amount of depression is detected by a pressure-sensitive sensor formed separately from the touch panel and placed on the touch panel in an overlapping manner.

When piezoelectric elements are used as the pressure-sensitive sensor in the touch type operation input device explained above, it is necessary to, e.g., apply a reference voltage of a predetermined bias to a piezoelectric element and use an amplification circuit such as an operational amplifier to amplify the output voltage in the piezoelectric element in order to detect the amount of depression.

Patent Literature 1: Japanese Patent Laid-Open No. H 5-61592

SUMMARY OF THE INVENTION

As described above, however, when the predetermined bias is applied to the piezoelectric element and the amplification circuit amplifies the output voltage, the reference voltage becomes unstable due to disturbance such as noises from the outside.

Therefore, when the operator actually presses the touch panel, the output voltage according to the true pressing force is not necessarily obtained.

Therefore, an object of the present invention is to provide a touch type operation input device capable of correcting the pressing force pressed by the operator without being affected by the instability of the reference voltage due to disturbance.

This invention relates to a touch type operation input device including a piezoelectric sensor configured to generate an output voltage in accordance with pressing force, a touch sensor configured to detect an operation input, and a pressing force detection unit configured to detect pressing force on the basis of the output voltage of the piezoelectric sensor, and has the following features. When the pressing force detection unit fails to obtain a detection result indicating that there is a certain operation input on the basis of an output signal given by the touch sensor, the pressing force detection unit causes a reference voltage of pressing force detection to be the same as the output voltage of the piezoelectric sensor. When the pressing force detection unit obtains a detection result indicating that there is a certain operation input on the basis of an output signal given by the touch sensor, the pressing force detection unit fixes the reference voltage, and detects pressing force from a difference in a voltage between the output voltage and the fixed reference voltage.

In this configuration, when a certain pressing force is applied to a predetermined position of the touch type operation input device, the reference voltage is fixed, and the pressing force is detected. Therefore, while reducing the instability of the reference voltage due to disturbance, the pressing force is detected.

In the touch type operation input device according to this invention, when an output signal indicating a pressed position given by the touch sensor is the same for a predetermined period of time or more, the pressing force detection unit determines to have obtained a detection result indicating that there is the certain operation input.

In this configuration, the pressing force is not detected in a case where the touch surface is touched by mistake, or in a case where the touch surface is touched while the operation position is moved on the touch surface. Accordingly, only when it is necessary to detect the pressing force, the pressing force can be detected.

The touch type operation input device according to this invention preferably has the following configuration. When the pressing force detection unit does not detect an output signal indicating the pressed position from the touch sensor, the pressing force detection unit stops pressing force detection. When the pressing force detection unit detects an output signal indicating the pressed position from the touch sensor, the pressing force detection unit starts pressing force detection.

In this configuration, while operation input is not performed, the pressing force detection unit is in the sleep mode, and when the operation input is performed, the pressing force detection unit is activated. Therefore, the touch type operation input device can achieve power saving.

In the touch type operation input device according to this invention, the pressing force detection unit can also correct the pressing force detected from the output voltage in accordance with the position on a touch surface indicated by the output signal indicating the pressed position given by the touch sensor.

In this configuration, the error of the pressing force detection value can be corrected, the error being caused by the difference of the amount of bending of the piezoelectric sensor in response to the pressing force in accordance with the position on the touch surface.

In the touch type operation input device according to this invention, the pressing force detection unit preferably performs correction to increase a sensitivity in response to a pressing force as the pressed portion is farther away from the center, on the basis of a distance between the center of the touch surface and the position on the touch surface indicated by the output signal indicating the pressed position.

In this configuration, regardless of the touch position on the touch surface, the pressing force can be detected more accurately.

The touch type operation input device according to this invention preferably has the following configuration. The touch sensor and the piezoelectric sensor include a flat film-shaped piezoelectric film including a first principal surface and a second principal surface facing each other, an electrostatic capacitance detection electrode formed on at least one of the first principal surface and the second principal surface of the piezoelectric film, and a piezoelectric voltage detection electrode formed on the first principal surface and the second principal surface of the piezoelectric film.

In this configuration, the piezoelectric sensor and the touch sensor can be formed by the single piezoelectric film and the electrodes formed on the piezoelectric film. Therefore, the piezoelectric sensor and the touch sensor can be integrated, and the thickness can be reduced.

In the touch type operation input device according to this invention, the piezoelectric film is made of polylactic acid subjected to stretching processing in at least one axis direction.

In this configuration, an example of material preferable for the piezoelectric film is shown. The polylactic acid having a high degree of molecule orientation degree in a predetermined direction by stretching has a high piezoelectric constant, and therefore, when the polylactic acid is used for the piezoelectric film, the detection sensitivity of the amount of depression in response to touching can be increased, and the detection sensitivity of change in the electrostatic capacitance caused by touching can be increased.

Further, since the polylactic acid has an extremely small internal haze value and a high total light transmittance, the highly translucent touch type operation input device can also be achieved. In addition, since the polylactic acid does not have pyroelectricity, the detection of the amount of depression (pressing force) is not affected even when the body heat is transmitted when a finger and the like is in contact with the touch surface. Therefore, even when the polylactic acid is used as the piezoelectric film, it is not necessary to perform correction for the body heat as compared with the case where a piezoelectric film having pyroelectricity such as PVDF is used. Alternatively, it is not necessary to provide a complicated mechanism for preventing the body heat from being transmitted to the piezoelectric film.

According to this invention, the pressing force Pressed by the operator can be detected correctly.

DETAILED DESCRIPTION OF THE INVENTION

Figure 1:
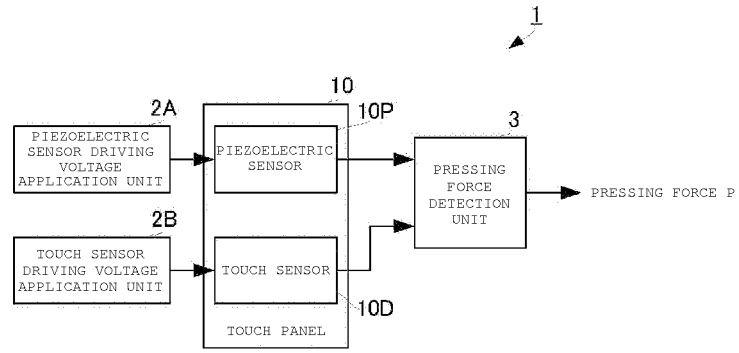
FIG. 1 is a block diagram illustrating a touch type operation input device 1 according to the present invention.

A touch type operation input device 1 according to the first embodiment of the present invention will be explained with reference to drawings. FIG. 1 is a block diagram illustrating a touch type operation input device 1 according to the present invention.

The touch type operation input device 1 includes a touch panel 10, a piezoelectric sensor driving voltage application unit 2A, a touch sensor driving voltage application unit 2B, and a pressing force detection unit 3.

The touch panel 10 is integrally formed by a piezoelectric sensor 10P and a touch sensor 10D using a single piezoelectric film 100. The piezoelectric sensor driving voltage application unit 2A applies a predetermined driving voltage to the piezoelectric sensor 10P. With this driving voltage, the reference voltage of the piezoelectric sensor 10P is determined. The touch sensor driving voltage application unit 2B applies a predetermined detection voltage to the touch sensor 10D.

Although a preferable detailed structure of the piezoelectric sensor 10P will be explained later, the piezoelectric sensor 10P includes a piezoelectric voltage detection electrode formed on a first principal surface of the piezoelectric film 100 which is made of polylactic acid (PLA) and a piezoelectric voltage detection electrode formed on a second principal surface thereof. When pressing force is applied to the touch panel 10 so that the piezoelectric film 100 is extended (or compressed) by very small bending of the touch panel 10, then the piezoelectric sensor 10P outputs an output voltage that is generated between the piezoelectric voltage detection electrode of the first principal surface and the piezoelectric voltage detection electrode of the second principal surface in accordance with the amount of displacement.

Although a preferable detailed structure of the touch sensor 10D will be explained later, the touch sensor 10D includes an electrostatic capacitance detection electrode formed on the first principal surface of the piezoelectric film 100 which is made of polylactic acid (PLA) and an electrostatic capacitance detection electrode formed on the second principal surface thereof. The touch sensor 10D detects change of an electric current between the electrostatic capacitance detection electrodes formed on the first principal surface and the second principal surface, the change being generated when the operator touches a predetermined position of a protection layer 30 with a finger, and outputs a position detection signal.

The pressing force detection unit 3 detects pressing force P onto the touch panel 10 on the basis of the output voltage given by the piezoelectric sensor 10P and the position detection signal given by the touch sensor 10D. Although not shown in the drawings, the touch type operation input device 1 also includes a function unit configured to detect the touch position on the basis of the position detection signal given by the touch sensor 10D.

Figure 2:
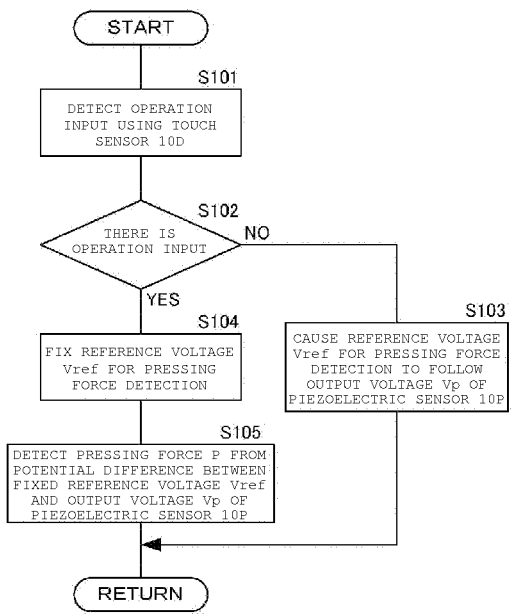
FIG. 2 is a flowchart illustrating processing flow of a pressing force detection unit 3 according to a first embodiment.
Figure 3:
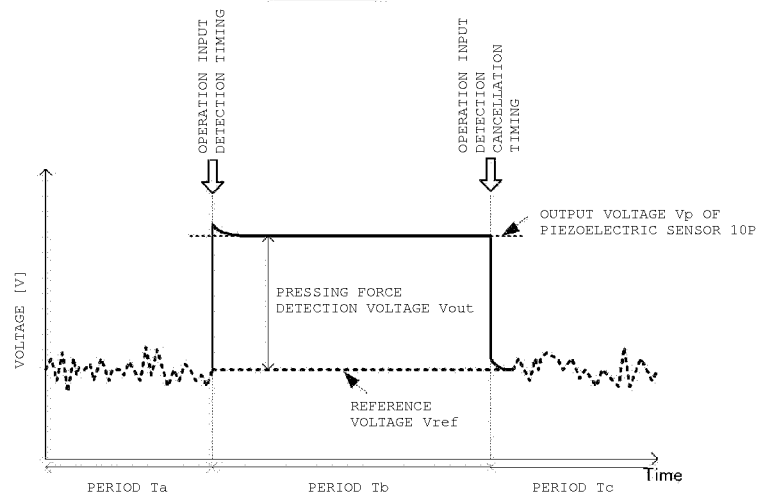
FIG. 3 is a view illustrating change of each voltage in a case where processing is performed by the pressing force detection unit 3 according to the first embodiment.

Subsequently, more specific processing performed by the pressing force detection unit 3 will be explained. FIG. 2 is a flowchart illustrating the processing flow of the pressing force detection unit 3. FIG. 3 is a view illustrating change of each voltage in a case where the pressing force detection unit 3 performs processing.

The pressing force detection unit 3 monitors the position detection signal given by the touch sensor 10D, thereby detecting whether there is an operation input with the touch sensor 10D (S101). When the pressing force detection unit 3 cannot obtain the position detection signal and determines that there is no operation input (S102: NO), the pressing force detection unit 3 causes the reference voltage Vref of the pressing force detection to follow the output voltage Vp of the piezoelectric sensor 10P as indicated by a period Ta in FIG. 3 (S103). In other words, the pressing force detection unit 3 changes the reference voltage Vref at all times so that the reference voltage Vref is the same as the output voltage Vp received from the piezoelectric sensor 10P.

When the pressing force detection unit 3 obtains the position detection signal and determines that there is an operation input (S102: YES), the pressing force detection unit 3 fixes the reference voltage Vref of the pressing force detection as indicated by a period Tb in FIG. 3 (S104). At this occasion, the pressing force detection unit 3 causes the reference voltage Vref to be the same as an output voltage Vp given when it was determined that there is an operation input, and fixes the reference voltage Vref. Alternatively, the pressing force detection unit 3 causes the reference voltage Vref to be the same as an output voltage Vp that had been obtained immediately before it was determined that there is an operation input, and fixes the reference voltage Vref.

After the pressing force detection unit 3 fixes the reference voltage Vref, the pressing force detection unit 3 obtains the output voltage Vp of the piezoelectric sensor 10P. The pressing force detection unit 3 calculates a pressing force detection voltage Vout by subtracting the reference voltage Vref from the output voltage Vp. The pressing force detection unit 3 uses a relationship table or a relational expression between the pressing force detection voltage Vout and the pressing force P stored in advance to calculate the pressing force P from the pressing force detection voltage Vout thus calculated (S105).

It should be noted that when the operation input is cancelled, the pressing force detection unit 3 cannot detect the position detection signal and determines that there is no operation input as indicated by a period Tc in FIG. 3. In this case, the pressing force detection unit 3 causes the reference voltage Vref to follow the output voltage Vp of the piezoelectric sensor 10P again.

By performing such processing, when the touch panel 10 is not operated as indicated by the period Ta in FIG. 3, the reference voltage Vref is adapted in accordance with the change of the external environment. Then, when the touch panel 10 is operated as indicated by the period Tb in FIG. 3, the reference voltage Vref is fixed, and the pressing force P can be detected from the difference from the output voltage Vp.

Therefore, this can reduce the error component of the pressing force detection voltage Vout that is caused by variation in the reference voltage Vref due to disturbance. Therefore, the pressing force detection voltage Vout can be detected with a high degree of accuracy, and the pressing force P can be detected with a high degree of accuracy.

At this occasion, for example, by using a structure for holding a very high input impedance of the operational amplifier connected to a rear stage of the piezoelectric sensor 10P and a structure for connecting a capacitor in parallel with the piezoelectric sensor 10P, the holding time of the output voltage Vp according to the pressing force P can be increased, which makes it easy to calculate the pressing force detection voltage Vout.

Figure 4:
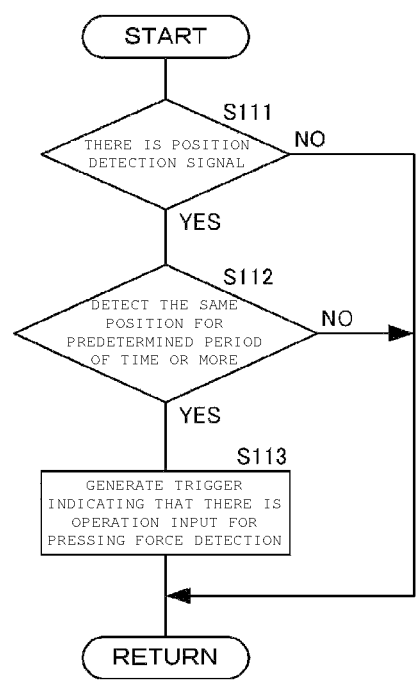
FIG. 4 is a flowchart illustrating an operation input detection flow of the pressing force detection unit 3.

By the way, when the user performs operation input with the touch panel 10, the user may simply trace the touch surface without giving a certain degree of pressing force. For example, moving the pointer of a mouse is one of such cases. In such case, sometimes it would be more preferable to cause the reference voltage Vref to follow the output voltage Vp when the user traces the touch surface rather than fix the reference voltage Vref in response to detection of the touch surface traced. In this case, for example, determination processing as to whether there is any operation input or not may be performed on the basis of the flow as shown in FIG. 4 below. FIG. 4 is a flowchart illustrating operation input detection flow of the pressing force detection unit 3.

The pressing force detection unit 3 monitors the position detection signal given by the touch sensor 10D, thus detecting whether there is any operation input or not with the touch sensor 10D. When the pressing force detection unit 3 cannot detect the position detection signal (S111: NO), the pressing force detection unit 3 continues to monitor the position detection signal. When the pressing force detection unit 3 detects the position detection signal (S111: YES), the pressing force detection unit 3 detects the pressed position on the touch surface on the touch sensor 10D from the position detection signal.

The pressing force detection unit 3 continues this processing, and when the pressing force detection unit 3 can detect the same position for a period of time equal to or more than a predetermined period of time that has been set in advance (S112: YES), the pressing force detection unit 3 generates an operation trigger of the pressing force detection (S113). When the pressing force detection unit 3 obtains the operation trigger of the pressing force detection, the pressing force detection unit 3 detects the pressing force P in accordance with the flow as shown in FIG. 2. When the period of time for which the same pressed position is detected is less than the predetermined period of time that is set in advance (S122: NO), the pressing force detection unit 3 continues to monitor the position detection signal. It should be noted that the "same pressed position" means that the position detection coordinate stays within a predetermined range.

Such processing is executed, so that when the user traces the touch surface, the reference voltage Vref follows the pressing force detection voltage Vout, and therefore the pressing force is not detected. Therefore, only when the operator intentionally presses down the touch surface, the reference voltage Vref is fixed, and the pressing force detection voltage Vout can be detected with a high degree of accuracy. Such processing is executed, so that even if the user unintentionally (by mistake) presses the touch surface, the reference voltage Vref is not fixed.

It should be noted that when the pressing force detection unit 3 does not obtain the operation trigger of the pressing force detection, software processing may be performed so as not to perform operation of the detection of the pressing force itself.

Subsequently, a configuration of the touch panel 10 more preferable for the touch type operation input device 1 explained above will be explained with reference to FIGS. 5 to 9.

Figure 5:
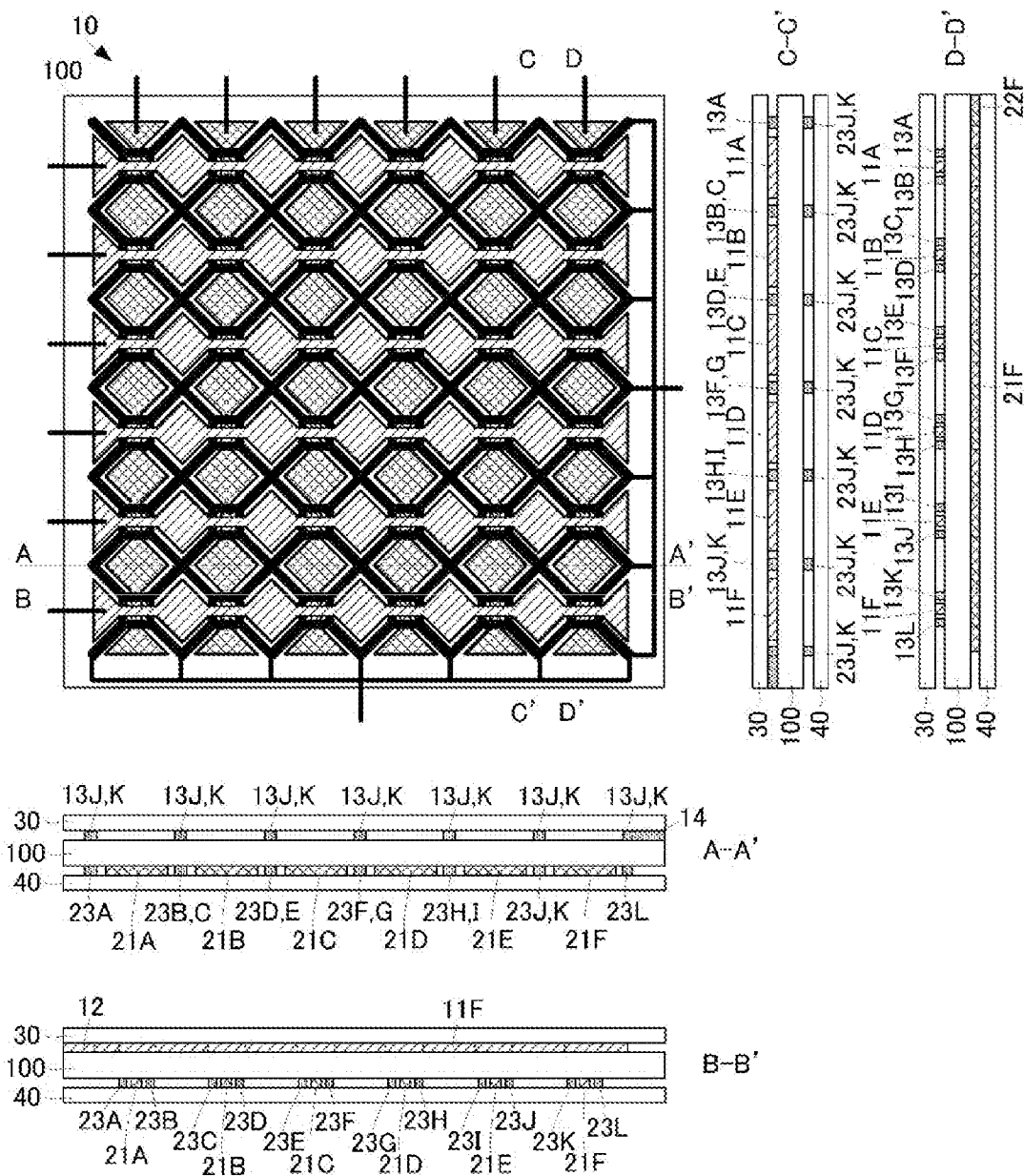
FIG. 5 includes a top view and multiple cross sectional views illustrating a touch panel 10 according to the present invention.
Figure 6:
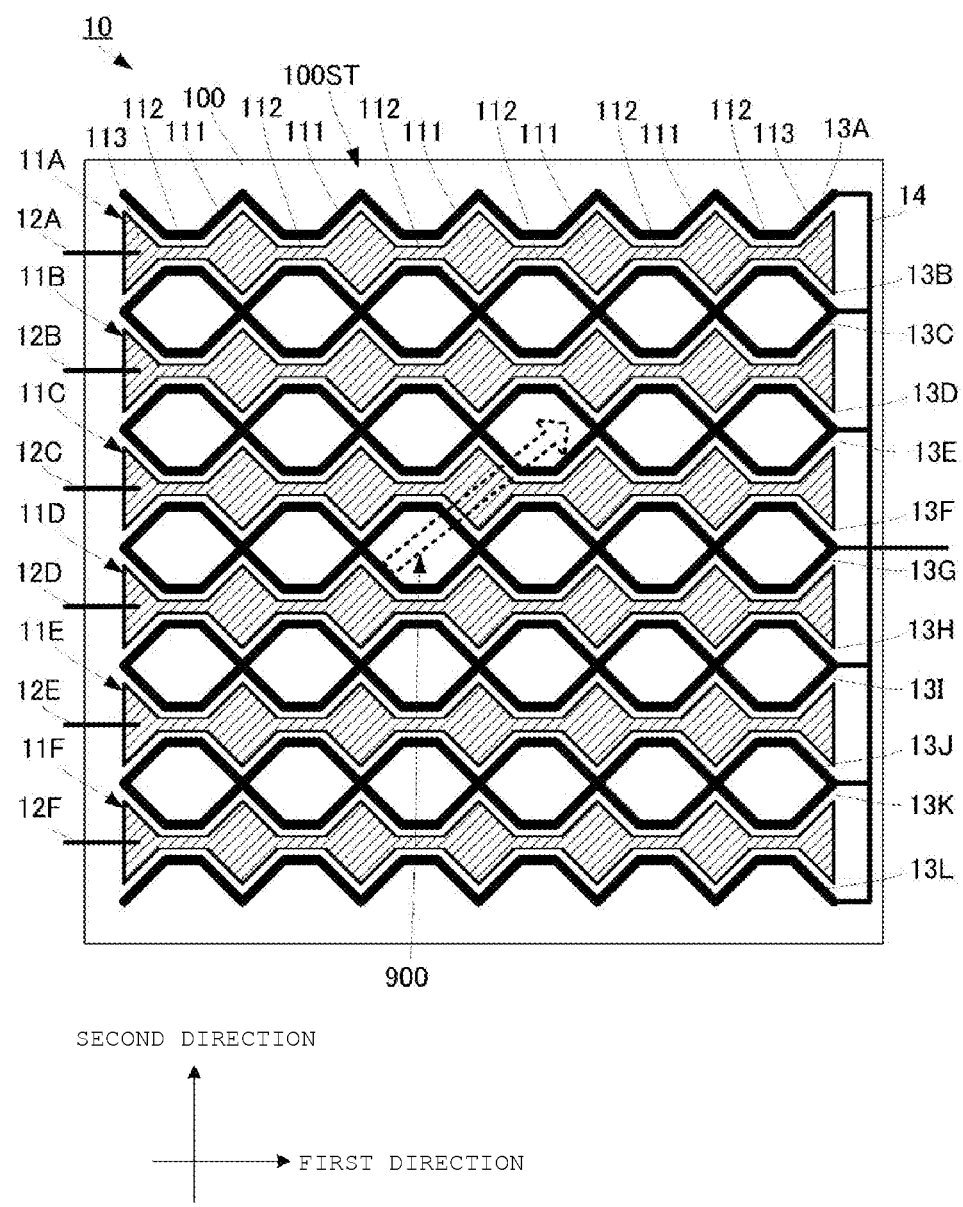
FIG. 6 is a top view illustrating a first principal surface 100ST of the touch panel 10 according to the present invention.
Figure 7:
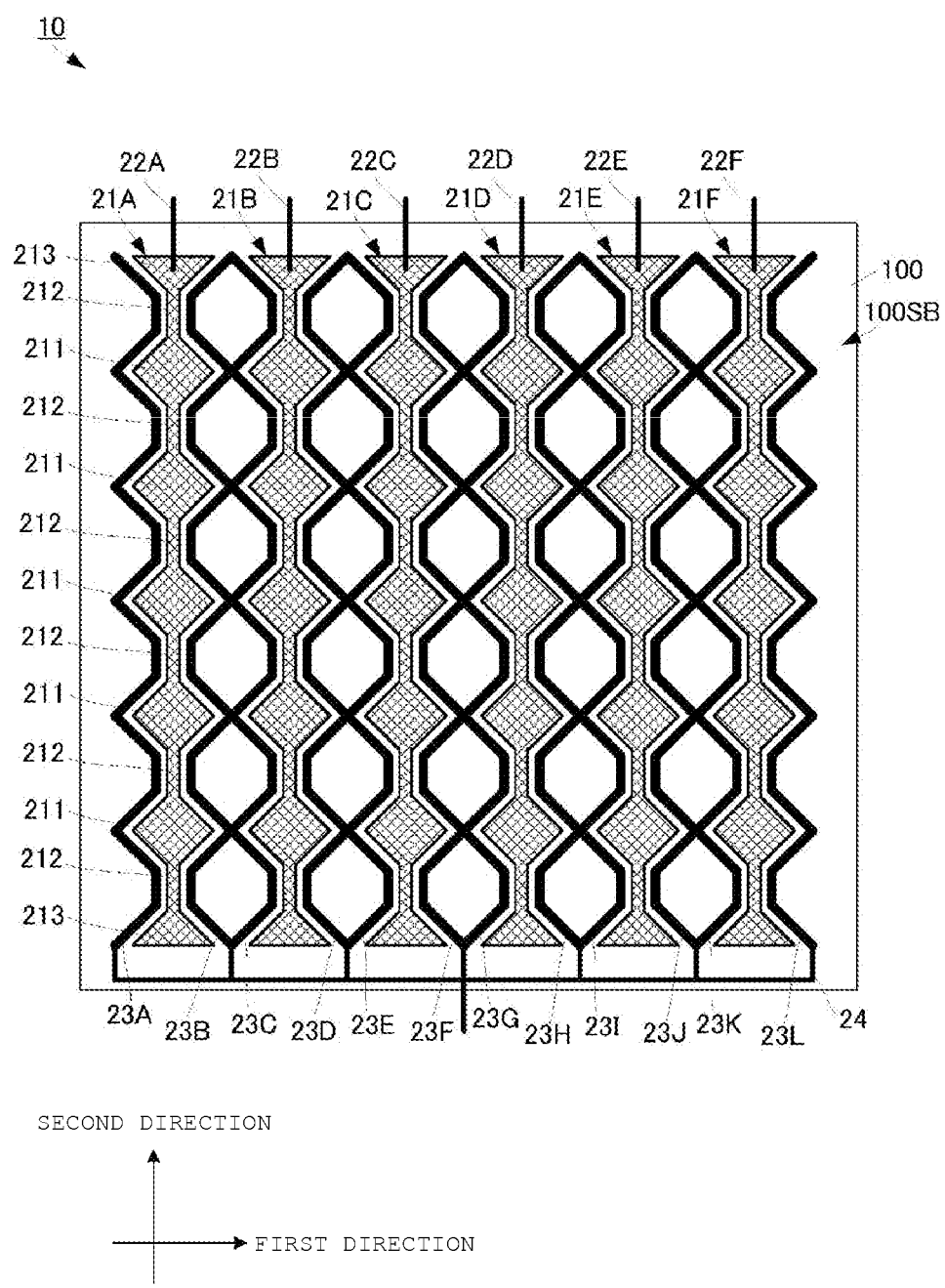
FIG. 7 is a top view illustrating a second principal surface 100SB of the touch panel 10 according to the present invention.
Figure 8:
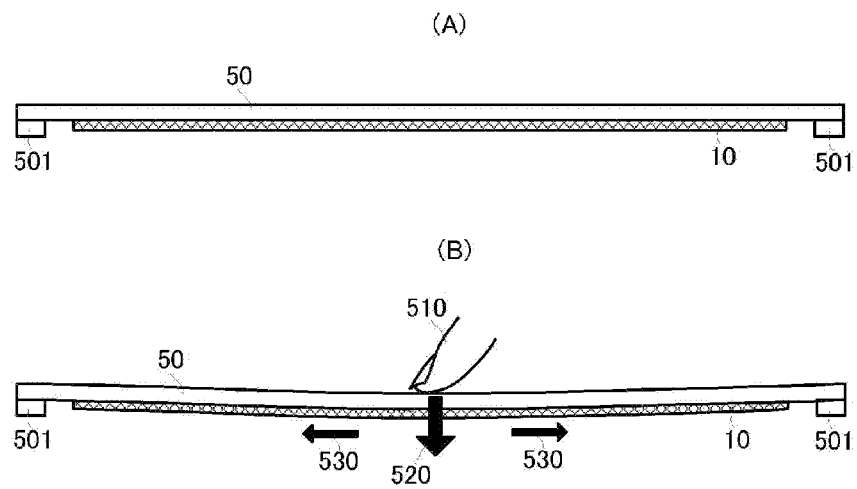
FIGS. 8A and 8B are views for explaining a depression amount detection function of the touch panel 10 according to the present invention.
Figure 9:
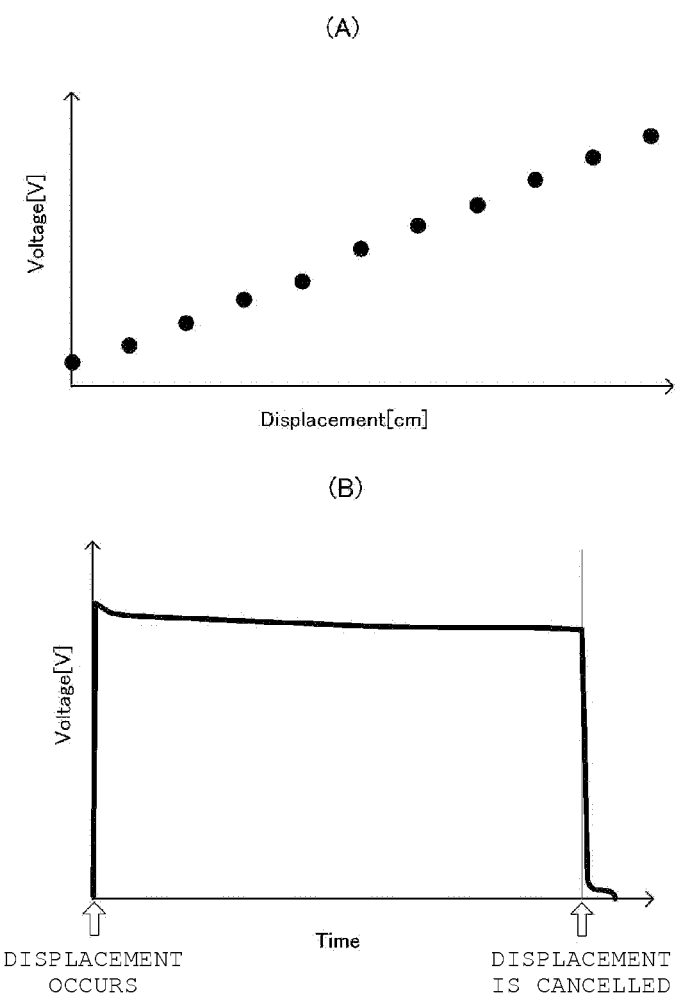
FIG. 9A is a waveform diagram illustrating an output voltage and a depression given by the touch panel 10 according to the present invention.
FIG. 9B is a graph illustration correlation between the output voltage and the amount of depression.

FIG. 5 includes a top view illustrating the touch panel 10 according to the first embodiment of the present invention, and also a cross sectional view taken along a-a', a cross sectional view taken along b-b', a cross sectional view taken along c-c', and a cross sectional view taken along d-d' of the top view. FIG. 6 is a top view illustrating a first principal surface 100ST of the touch panel 10 according to the first embodiment of the present invention. FIG. 7 is a top view illustrating a second principal surface 100SB of the touch panel 10 according to the first embodiment of the present invention. FIGS. 6, 7 are views when the first principal surface 100ST and the second principal surface 100SB are seen from the first principal surface 100SST. The electrode patterns of FIGS. 5, 6, 7 are examples, and the number of arrangements of the first line-shaped electrodes, the second line-shaped electrodes, the third line-shaped electrode, and the fourth line-shaped electrodes are not limited thereto, and may be determined as necessary in accordance with the specification of the touch panel.

The touch panel 10 includes a piezoelectric film 100, protection layers 30, 40, and includes piezoelectric detection electrodes and electrostatic capacitance detection electrodes formed in the pattern explained below.

The piezoelectric film 100 is made of a rectangular flat film including a first principal surface 100ST and a second principal surface 100SB facing each other. The piezoelectric film 100 is made of monoaxially stretched polylactic acid (PLA).

PLA is chirality polymer, and the principal chain thereof has a spiral structure. PLA is monoaxially stretched, and when molecules are oriented, PLA has piezoelectric property. The piezoelectric constant of the monoaxially stretched PLA belongs to an extremely high type among polymers.

The stretching rate is preferably about 3 to 8 times. By applying thermal treatment after stretching, crystallization of the extended chain crystals of PL is accelerated, which improves the piezoelectric constant. When biaxially stretched, the same effects as the monoaxially stretching can be obtained by changing the stretching rates of the axes. For example, when a certain direction is adopted as X axis, and stretching is done in that direction by eight times and stretching is done in the Y axis direction perpendicular to the X axis by two times, the piezoelectric constant provides almost the same effect as the case where about four-times monoaxial stretching is done in the X axis direction. When a film is simply monoaxially stretched, the film is easily torn along the stretched axis direction, and therefore, the strength can be somewhat increased by doing the biaxial stretching explained above.

PLA has piezoelectric property as a result of orientation processing of molecules such as stretching, and it is not necessary to perform poling processing like piezoelectric ceramics and other polymers such as PVDF. More specifically, the piezoelectric property of PLA that does not belong to ferroelectric substance is not achieved by polarization of ions like ferroelectric substances such as PVDF and PZT, but is derived from the spiral structure which is a structure peculiar to the molecules. For this reason, PLA does not cause pyroelectricity that is generated by other ferroelectric piezoelectric bodies. Further, PVDF and the like has a change of the piezoelectric constant over time, and in some cases the piezoelectric constant significantly decreases, but the piezoelectric constant of PLA is extremely stable over time. It should be noted that polylactic acid (pla) includes L-type polylactic acid (PLLA) and D-type polylactic acid (PDLA), but it is preferable to use PLLA in view of the manufacturing cost and the like.

PLLA has a relative permittivity of about 2.5 which is extremely low, and where d denotes a piezoelectric constant and $\varepsilon^T$ denotes a dielectric constant, a piezoelectric output constant (=piezoelectric g constant, $g=d/\varepsilon^T$) is of a large value.

In this case, the piezoelectric g constant of PVDF having a dielectric constant of $\varepsilon_{33}{}^T=13\times\varepsilon_0$ and a piezoelectric constant of $d_{31}=25$ pC/N is $g_{31}=0.2172$ Vm/N from the above expression. On the other hand, when the piezoelectric g constant of PLLA having a piezoelectric constant of $d_{14}=10$pC/N is derived by converting into $g_{31}$, $d_{14}=2\times d_{31}$ holds and therefore $d_{31}=5$pC/N is obtained, and the piezoelectric g constant is $g_{31}=0.2258$ Vm/N. Therefore, PLLA having the piezoelectric constant of $d_{14}=10$pC/N can obtain a sufficient level of detection sensitivity of the amount of depression like PVDF. The inventors of the invention of the present application obtain PLLA having $d_{14}=15$ to 20pC/N through experiment, and by using PLLA, the amount of depression can be detected with a still higher degree of sensitivity.

Multiple first line-shaped electrodes 11A, 11B, 11C, 11D, 11E, 11F serving as the electrostatic capacitance detection electrodes and third line-shaped electrodes 13A, 13B, 13C, 13D, 13E, 13F, 13G, 13H, 13I, 13J, 13K, 13L serving as the pressing force detection electrodes are formed in the pattern as shown in FIGS. 5, 6 on the first principal surface 100ST of the piezoelectric film 100 made of PLLA having such characteristics. These multiple first line-shaped electrodes 11A to 11F and multiple line-shaped electrodes 13A to 13L preferably use any one of organic electrodes mainly made of ITO, ZNO, silver nanowires, polythiophene and organic electrodes mainly made of polyaniline. By using these materials, highly translucent electrode patterns can be formed. When the translucent property is not needed, electrodes formed with silver paste and metal electrodes formed by evaporation, sputtering, or plating can be used.

The multiple first line-shaped electrodes 11A to 11F are made in the same shapes. More specifically, for example, the first line-shaped electrode 11A includes multiple wide width portions 111, multiple narrow width portions 112, and a pair of wide width portions 113 for end portions. Each wide width portion 111 is made of a square. The narrow width portion 112 is made of a rectangular shape of which length is longer than the width. The wide width portion 113 for the end portion is made of a substantially isosceles triangle. Multiple wide width portions 111 and multiple narrow width portions 112 are connected to be arranged alternately along the direction in which the first line-shaped electrode 11A extends. At this occasion, each wide width portion 111 is connected to the narrow width portion 112 so that the diagonal line of the square is in parallel with the connection direction to the narrow width portion 112. Further, a pair of vertexes, which form the diagonal line, of each wide width portion 111 are connected to the narrow width portions 112.

The wide width portions 113 for the end portions are provided at both ends in the direction in which the first line-shaped electrode 11A is extended. Both ends of the continuous electrode pattern including the multiple wide width portions 111 and the multiple narrow width portions 112 are connected via the narrow width portions 112 to the wide width portion 113 for the end portion. At this occasion, the vertex of the isosceles triangle of the wide width portion 113 for the end portion is connected to the narrow width portion 112.

The multiple first line-shaped electrodes 11A to 11F are formed to extend along the first direction on the first principal surface 100ST of the piezoelectric film 100. The multiple first line-shaped electrodes 11A to 11F are formed with a predetermined interval along the second direction perpendicular to the first direction on the first principal surface 100ST. At this occasion, the multiple first line-shaped electrodes 11A to 11F are formed so that the wide width portions 111 of each of them are at the position along the first direction. In other words, the multiple first line-shaped electrodes 11A to 11F are formed so that the wide width portions 111 are arranged along the second direction in each of them.

In this case, the first direction and the second direction are configured to be directions forming substantially 45 degrees with respect to the monoaxially stretched direction 900 of the piezoelectric film 100. Substantially 45 degrees means, for example, an angle including 45 degrees±about 10 degrees. These angles are design choices that should be determined as necessary in accordance with the entire design such as detection accuracy of bending on the basis of the purpose of the displacement sensor.

The multiple third line-shaped electrodes 13A to 13L are in the shape along the external shapes of the first line-shaped electrodes 11A to 11F, and are formed spaced apart from the first line-shaped electrodes 11A to 11F.

More specifically, the third line-shaped electrode 13A is formed along the external shape of the first line-shaped electrode 11A at the side opposite to the first line-shaped electrode 11B, and is formed spaced apart from the first line-shaped electrode 11A.

The third line-shaped electrode 13B is formed along the external shape of the first line-shaped electrode 11A at the first line-shaped electrode 11B, and is formed spaced apart from the first line-shaped electrode 11A. The third line-shaped electrode 13C is formed along the external shape of the first line-shaped electrode 11B at the first line-shaped electrode 11A, and is formed spaced apart from the first line-shaped electrode 11B. The third line-shaped electrodes 13B, 13C are connected to each other at around the corner portion of the wide width portion 111 and the corner portion of the wide width portion 113 at the end of the first line-shaped electrode.

The third line-shaped electrode 13D is formed along the external shape of the first line-shaped electrode 11B at the first line-shaped electrode 11C, and is formed spaced apart from the first line-shaped electrode 11B. The third line-shaped electrode 13E is formed along the external shape of the first line-shaped electrode 11C at the first line-shaped electrode 11B, and is formed spaced apart from the first line-shaped electrode 11C. The third line-shaped electrodes 13D, 13E are connected to each other at around the corner portion of the wide width portion 111 and the corner portion of the wide width portion 113 at the end of the first line-shaped electrode.

The third line-shaped electrode 13F is formed along the external shape of the first line-shaped electrode 11C at the first line-shaped electrode 11D, and is formed spaced apart from the first line-shaped electrode 11C. The third line-shaped electrode 13G is formed along the external shape of the first line-shaped electrode 11D at the first line-shaped electrode 11C and is formed spaced apart from the first line-shaped electrode 11D. The third line-shaped electrodes 13F, 13G are connected to each other at around the corner portion of the wide width portion 111 and the corner portion of the wide width portion 113 at the end of the first line-shaped electrode.

The third line-shaped electrode 13H is formed along the external shape of the first line-shaped electrode 11D at the first line-shaped electrode 11E, and is formed spaced apart from the first line-shaped electrode 11D. The third line-shaped electrode 13I is formed along the external shape of the first line-shaped electrode 11E at the first line-shaped electrode 11D and is formed spaced apart from the first line-shaped electrode 11E. The third line-shaped electrodes 13H, 13I are connected to each other at around the corner portion of the wide width portion 111 and the corner portion of the wide width portion 113 at the end of the first line-shaped electrode.

The third line-shaped electrode 13J is formed along the external shape of the first line-shaped electrode 11E at the first line-shaped electrode 11F, and is formed spaced apart from the first line-shaped electrode 11E. The third line-shaped electrode 13K is formed along the external shape of the first line-shaped electrode 11E at the first line-shaped electrode 11F and is formed spaced apart from the first line-shaped electrode 11F. The third line-shaped electrodes 13J, 13K are connected to each other at around the corner portion of the wide width portion 111 and the corner portion of the wide width portion 113 at the end of the first line-shaped electrode.

The third line-shaped electrode 13L is formed along the external shape of the first line-shaped electrode 11F at the side opposite to the first line-shaped electrode 11E, and is formed spaced apart from the first line-shaped electrode 11F.

The third line-shaped electrodes 13A to 13K are combined by a routing electrode 14, and are connected to the external circuit. The first line-shaped electrodes 11A to 11F are connected to the routing electrodes 12A to 12F, respectively, and are connected to the external circuit via the routing electrodes 12A to 12F. These routing electrodes 12A to 12F, and 14 are formed outside of the region where the first line-shaped electrodes 11A to 11F and the third line-shaped electrodes 13A to 13K are formed. Further, the routing electrodes 12A to 12F are formed at one end in the first direction, and the routing electrode 14 are formed at the other end in the first direction.

Multiple second line-shaped electrodes 21A, 21B, 21C, 21D, 21E, 21F serving as electrostatic capacitance detection electrodes and multiple fourth line-shaped electrodes 23A, 23B, 23C, 23D, 23E, 23F, 23G, 23H, 23I, 23J, 23K, 23L serving as pressing force detection electrodes are formed in the pattern as shown in FIGS. 1, 3 on the second principal surface 100SB of the piezoelectric film 100. These multiple second line-shaped electrodes 21A to 21F and line-shaped electrodes 23A to 23L also preferably use any one of organic electrodes mainly made of ITO, ZNO, silver nanowires, polythiophene and organic electrodes mainly made of polyaniline. By using these materials, highly translucent electrode patterns can be formed. When the translucent property is not needed, electrodes formed with silver paste and metal electrodes formed by evaporation, sputtering, or plating can be used.

The multiple second line-shaped electrodes 21A to 21F are made in the same shapes. More specifically, for example, the second line-shaped electrode 21A includes multiple wide width portions 211, multiple narrow width portions 212, and a pair of wide width portions 213 for end portions. Each wide width portion 211 is made of a square. The narrow width portion 212 is made of a rectangular shape of which length is longer than the width. The wide width portion 213 for the end portion is made of a substantially isosceles triangle. Multiple wide width portions 211 and multiple narrow width portions 212 are connected to be arranged alternately along the direction in which the second line-shaped electrode 21A extends. At this occasion, each wide width portion 211 is connected to the narrow width portion 212 so that the diagonal line of the square is in parallel with the connection direction to the narrow width portion 212. Further, a pair of vertexes, which form the diagonal line, of each wide width portion 211 are connected to the narrow width portions 212.

The wide width portions 213 for the end portions are provided at both ends in the direction in which the second line-shaped electrode 21A extends. Both ends of the continuous electrode pattern including the multiple wide width portions 211 and the multiple narrow width portions 212 are connected via the narrow width portions 212 to the wide width portion 213 for the end portion. At this occasion, the vertex of the isosceles triangle of the wide width portion 213 for the end portion is connected to the narrow width portion 212.

The multiple second line-shaped electrodes 21A to 21F are formed to extend along the second direction on the second principal surface 100SB of the piezoelectric film 100. The multiple second line-shaped electrodes 21A to 21F are formed with a predetermined interval along the first direction perpendicular to the second direction on the second principal surface 100SB. At this occasion, the multiple second line-shaped electrodes 21A to 21F are formed so that the wide width portions 211 of each of them are at the position along the second direction. In other words, the multiple second line-shaped electrodes 21A to 21F are formed so that the wide width portions 211 are arranged along the first direction in each of them.

The multiple second line-shaped electrodes 21A to 21F are formed so that the wide width portions 221 of each of them does not face the wide width portion 111 of the first line-shaped electrodes 11A to 11F with the piezoelectric film 100 interposed therebetween. In other words, the second line-shaped electrodes 21A to 21F are formed so that, when seen from the first principal surface 100ST, each of the wide width portions 221 constituting the multiple second line-shaped electrodes 21A to 21F does not overlap each wide width portion 111 constituting the first line-shaped electrodes 11A to 11F. In a still other expression, only in the narrow width portions 112, 212, the multiple first line-shaped electrodes 11A to 11F and the multiple second line-shaped electrodes 21A to 21F face each other with the piezoelectric film 100 interposed therebetween.

Further, the first line-shaped electrodes 11A to 11F and the second line-shaped electrodes 21A to 21F are formed so that when seen from the first principal surface 100ST, a gap of a predetermined width is made between each wide width portion 221 constituting the multiple second line-shaped electrodes 21A to 21F and each wide width portion 111 constituting the first line-shaped electrodes 11A to 11F. This width of the gap is configured such that the line-shaped electrodes 13A to 13K formed on the first principal surface 100ST fit within the gaps when seen from the first principal surface 100ST.

The multiple fourth line-shaped electrodes 23A to 23L are in the shape along the external shape of the second line-shaped electrodes 21A to 21F, and are formed spaced apart from the second line-shaped electrodes 21A to 21F.

More specifically, the fourth line-shaped electrode 23A is formed along the external shape of the second line-shaped electrode 21A at the side opposite to the second line-shaped electrode 21B, and is formed spaced apart from the second line-shaped electrode 21A.

The fourth line-shaped electrode 23B is formed along the external shape of the second line-shaped electrode 21A at the second line-shaped electrode 21B, and is formed spaced apart from the second line-shaped electrode 21A. The fourth line-shaped electrode 23C is formed along the external shape of the second line-shaped electrode 21B at the second line-shaped electrode 21A, and is formed spaced apart from the second line-shaped electrode 21B. The fourth line-shaped electrode 23B, 23C are connected to each other at around the corner portion of the wide width portion 211 and the corner portion of the wide width portion 213 at the end of the second line-shaped electrode.

The fourth line-shaped electrode 23D is formed along the external shape of the second line-shaped electrode 21B at the second line-shaped electrode 21C, and is formed spaced apart from the second line-shaped electrode 21B. The fourth line-shaped electrode 23E is formed along the external shape of the second line-shaped electrode 21C at the second line-shaped electrode 21B, and is formed spaced apart from the second line-shaped electrode 21C. The fourth line-shaped electrode 23D, 23E are connected to each other at around the corner portion of the wide width portion 211 and the corner portion of the wide width portion 213 at the end of the second line-shaped electrode.

The fourth line-shaped electrode 23F is formed along the external shape of the second line-shaped electrode 21C at the second line-shaped electrode 21D, and is formed spaced apart from the second line-shaped electrode 21C. The fourth line-shaped electrode 23G is formed along the external shape of the second line-shaped electrode 21D at the second line-shaped electrode 21C, and is formed spaced apart from the second line-shaped electrode 21D. The fourth line-shaped electrode 23F, 23G are connected to each other at around the corner portion of the wide width portion 211 and the corner portion of the wide width portion 213 at the end of the second line-shaped electrode.

The fourth line-shaped electrode 23H is formed along the external shape of the second line-shaped electrode 21D at the second line-shaped electrode 21E, and is formed spaced apart from the second line-shaped electrode 21D. The fourth line-shaped electrode 23I is formed along the external shape of the second line-shaped electrode 21E at the second line-shaped electrode 21D, and is formed spaced apart from the second line-shaped electrode 21E. The fourth line-shaped electrode 23H, 23I are connected to each other at around the corner portion of the wide width portion 211 and the corner portion of the wide width portion 213 at the end of the second line-shaped electrode.

The fourth line-shaped electrode 23J is formed along the external shape of the second line-shaped electrode 21E at the second line-shaped electrode 21F, and is formed spaced apart from the second line-shaped electrode 21E. The fourth line-shaped electrode 23K is formed along the external shape of the second line-shaped electrode 21F at the second line-shaped electrode 21E, and is formed spaced apart from the second line-shaped electrode 21F. The fourth line-shaped electrode 23J, 23K are connected to each other at around the corner portion of the wide width portion 211 and the corner portion of the wide width portion 213 at the end of the first line-shaped electrode.

The fourth line-shaped electrode 23L is formed along the external shape of the second line-shaped electrode 21F at the side opposite to the second line-shaped electrode 21E, and is formed spaced apart from the second line-shaped electrode 21F.

Substantially over the entire length in the gap formed between the wide width portions 211, 213 and the wide width portions 111, 113 when seen from the first principal surface 100ST, the fourth line-shaped electrodes 23A to 23L formed on the second principal surface 100SB and the third line-shaped electrodes 13A to 13K formed on the first principal surface 100ST are formed to be opposite to each other with the piezoelectric film 100 interposed therebetween For example, as shown in FIG. 5, between the wide width portion 213 for the end portion of the second line-shaped electrode 21A and the wide width portion 113 for the end portion of the first line-shaped electrode 11A, the fourth line-shaped electrode 23A faces the third line-shaped electrode 13A. Between the wide width portion 211 of the second line-shaped electrode 21A and the wide width portion 113 for the end portion of the first line-shaped electrodes 11A, 11B, the fourth line-shaped electrode 23A faces the third line-shaped electrodes 13B, 13C.

As shown in FIG. 5, the other portions other than the fourth line-shaped electrode 23A also similarly face the third line-shaped electrode 13D to 13L. The other fourth line-shaped electrodes 23B to 23L face the third line-shaped electrodes 13A to 13L, respectively.

The fourth line-shaped electrodes 23A to 23K are combined by the routing electrode 24, and are connected to the external circuit. The second line-shaped electrodes 21A to 21F are connected to routing electrodes 22A to 22F, respectively, and are connected via the routing electrodes 22A to 22F to the external circuit. These routing electrodes 22A to 22F, and 24 are formed outside of the region where the second line-shaped electrodes 21A to 21F and the fourth line-shaped electrodes 23A to 23K are formed. Further, the routing electrodes 22A to 22F are formed at one end in the second direction, and the routing electrode 24 is formed at the other end in the second direction.

As described above, the touch panel 10 of the touch panel 1 is constituted by the piezoelectric film 100 formed with the first line-shaped electrodes 11A to 11F, the third line-shaped electrodes 13A to 13L, the second line-shaped electrodes 21A to 21F, and the fourth line-shaped electrodes 23A to 23L.

At the first principal surface 100ST of the piezoelectric film 100 of the touch panel 10, the protection layer 30 is provided to cover the entire surface of the electrode pattern formed area of the first line-shaped electrodes 11A to 11F and third line-shaped electrodes 13A to 13L. The protection layer 30 is made of a material having insulating property and having translucent property. When the translucent property is not needed, the material is not particularly limited as long as it has insulating property.

At the second principal surface 100SB of the piezoelectric film 100 of the touch panel 10, a protection layer 40 is provided to cover the entire surface of the electrode pattern formed area of the second line-shaped electrodes 21A to 21F and the fourth line-shaped electrodes 23A to 23L. Like the protection layer 30, the protection layer 40 is also made of a material having insulating property and having translucent property. It should be noted that the protection layers 30, 40 may be made of polyethylene terephthalate PET, polyethylene naphthalate PEN, polypropylene PP, and the like, and may be formed in a shape (thickness and the like) so as not to hinder bending of the piezoelectric film 100. When the translucent property is not needed, the material is not particularly limited as long as it has insulating property.

The touch panel 10 having the structure as described above detects the touch position and the amount of depression as shown below.

First, touch position is detected in accordance with the following principal. In the configuration of the present embodiment, a detection concept of a touch position based on a so-called projection-type mutual capacitance method is used. The explanation about the detailed detection concept is omitted. Therefore, in the explanation below, the detection concept of the touch position will be schematically explained.

The first line-shaped electrodes 11A to 11F receive driving signals via the routing electrodes 12A to 12F. The second line-shaped electrodes 21A to 21F are connected via the routing electrodes 22A to 22F to the detection circuit, not shown.

When the operator touches a predetermined position of the protection layer 30 with his finger under such circumstances, a part of an electric field at the touch position is induced to the finger. Thus, at the touch position, the electric current changes from that when the operator does not touch with his finger. Therefore, such change in the electric current is detected with the detection circuit, so that a position detection signal is generated in accordance with the touch position, and the touch with the finger can be detected.

In this case, as described above, the first line-shaped electrodes 11A to 11F are arranged with the predetermined interval along the second direction in the shape extending in the first direction, and the second line-shaped electrodes 21A to 21F are arranged with the predetermined interval along the first direction in the shape extending in the second direction. The position where the first line-shaped electrodes 11A to 11F face the second line-shaped electrodes 21A to 21F with the piezoelectric film 100 interposed therebetween, i.e., the position where an electric field is generated and an electric current of detection flows, can be detected based on two-dimensional coordinate from a combination of the first line-shaped electrode and the second line-shaped electrode constituting the facing position. For example, when the operator touches around the facing position of the first line-shaped electrode 11C and the second line-shaped electrode 21D, the electric field changes around the facing position, and changes occur in the electric current flowing from the first line-shaped electrode 11C via the second line-shaped electrode 21D. At this occasion, the electric field does not change in the other facing positions, and therefore, the electric current does not change. By making use of such principal, the touch position can be detected.

Further, the first line-shaped electrodes 11A to 11F and the second line-shaped electrodes 21A to 21F according to the present embodiment are arranged such that, when seen in the direction perpendicular to the first principal surface 100ST which is the operation surface, the first line-shaped electrodes 11A to 11F and the second line-shaped electrodes 21A to 21F according to the present embodiment face each other at the narrow width portions 112, 212, but the first line-shaped electrodes 11A to 11F and the second line-shaped electrodes 21A to 21F according to the present embodiment do not overlap each other in the wide width portions 111, 112, so that both of the first line-shaped electrodes 11A to 11F and second line-shaped electrodes 21A to 21F easily change in the electric field caused by the touch with the finger. Thus, the detection accuracy of the touch can be improved.

Subsequently, the detection concept of the amount of depression will be explained. FIGS. 8A and 8B are views for explaining a depression amount detection function of the touch panel 10 according to the first embodiment of the present invention. FIG. 8A illustrates a situation where the amount of depression is not applied. FIG. 8B illustrates a situation where the amount of depression is not applied with a finger. FIG. 9A is a graph illustrating correlation between the amount of depression and the detection voltage. FIG. 9B is a waveform diagram illustrating the detection voltage of the amount of depression of the touch panel 10 according to the first embodiment of the present invention.

As shown in FIG. 8A, the touch panel 10 of the touch panel 1 is attached to one of the principal surfaces of the flat plate like elastic body 50 so that the flat surfaces of both of them are closely in contact with each other. The elastic body 50 is made of glass, acryl, polycarbonate, and the like. The elastic body 50 is not limited to the materials listed here. An appropriate material may be chosen in accordance with the usage condition. The surface to which the touch panel 10 of the touch panel 1 is adhered may be an appropriate surface chosen in accordance with the usage condition. Both opposing ends of the elastic body 50 are supported by support bodies 501. More specifically, in a case of the touch panel 1, both ends of the touch panel 1 in the first direction are fixed. In this state, the elastic body 50 is not bent, and stress is not applied to the piezoelectric film 100, and therefore no charge is generated.

As shown in FIG. 8B, when the surface of the elastic body 50 is pushed with a finger 510, pressing force indicated by a thick arrow 520 is applied to the elastic body 50. In this case, the elastic body 50 is bent to swell to the surface where the touch panel 10 is arranged. Therefore, the piezoelectric film 100 of the touch panel 10 is extended substantially along the first direction, and pulling stress as indicated by a thick arrow 530 is generated. With this stress, the piezoelectric film 100 is polarized into the first principal surface 100ST and the second principal surface 100SB.

In this case, as described above, the third line-shaped electrodes 13A to 13L are formed on the first principal surface 100ST, and the fourth line-shaped electrodes 23A to 23L are formed on the second principal surface 100SB, so that a potential difference is generated between the third line-shaped electrodes 13A to 13L and the fourth line-shaped electrodes 23A to 23L. Therefore, this potential difference, i.e., the piezoelectric voltage is detected, whereby the pressing with the finger, i.e., pressure by the touch with the finger, can be detected.

Further, as shown in FIG. 9A, in PLA, the output voltage Vp (piezoelectric voltage) changes in a linear manner in accordance with the amount of depression (corresponding to the pressing force P). At this occasion, as described above, the reference voltage Vref is appropriately fixed in accordance with the situation, so that the pressing force detection voltage Vout can be detected correctly. Because of such effects, when the output voltage Vp of the touch panel 10 is measured, the pressing force P can be detected in an easy manner and with a high degree of accuracy. More specifically, it is possible to accurately detect whether the operator lightly touches the operation surface or strongly presses down the operation surface. It should be noted that the output voltage Vp of the touch panel 10 is usually generated as soon as stress is applied, and the charge is leaked due to the piezoelectric effects, and the value of the output voltage Vp rapidly decreases. However, as described above, when the detection circuit having a high input impedance is used for the detection circuit of the output voltage Vp, the value of the output voltage Vp can be maintained for a predetermined period of time as shown in FIG. 9B. Accordingly, the value of the output voltage Vp can be more reliably measured, and the pressing force P can be detected.

As described above, when the touch panel 10 according to the above aspect is used, the pressing force P can be detected in an easy manner and with a high degree of accuracy. Further, when the touch panel 10 according to the above aspect is used, the touch position and the pressing force can be detected at a time by just forming the electrostatic capacitance detection electrodes and the pressing force detection electrodes on both of the opposing surfaces of the single piezoelectric film 100. Therefore, the thin touch type operation input device can be achieved. Further, the highly translucent touch type operation input device can be achieved.

Further, by using PLA of the piezoelectric film 100, the touch panel 10 is not affected by the pyroelectricity. Therefore, during detection, the output voltage Vp according to only the pressing force P can be obtained without relying on the temperature of the detection position. More specifically, the pressing force P can be detected in an adaptive manner to the reference voltage Vref described above and with a high degree of accuracy. PLA is polymer, and has flexibility, and therefore, it is less likely to be broken by a large displacement like piezoelectric ceramics. Therefore, even when the amount of displacement is large, the amount of displacement can be detected reliably.

In the above explanation, the protection layers 30, 40 are simply arranged, but the first principal surface 100ST of the touch panel 10 may be in contact with the elastic body 50 such as an acrylic plate having a high elastic modulus as described above, and the protection layer 40 may be provided only on the second principal surface 100SB.

The protection layers 30, 40 may be arranged, and the surface of the protection layer 40 opposite to the touch panel 10 may have adhesive property. Further, when this adhesive property is configured to be weak, a touch panel that can be attached or removed in accordance with the location where the touch panel is used can be achieved.

The touch panel 10 according to the aspect described above is merely an example, and even when a touch panel according to another aspect in which a piezoelectric sensor and a touch sensor are integrated is used, the above configuration can be applied.

Figure 10:
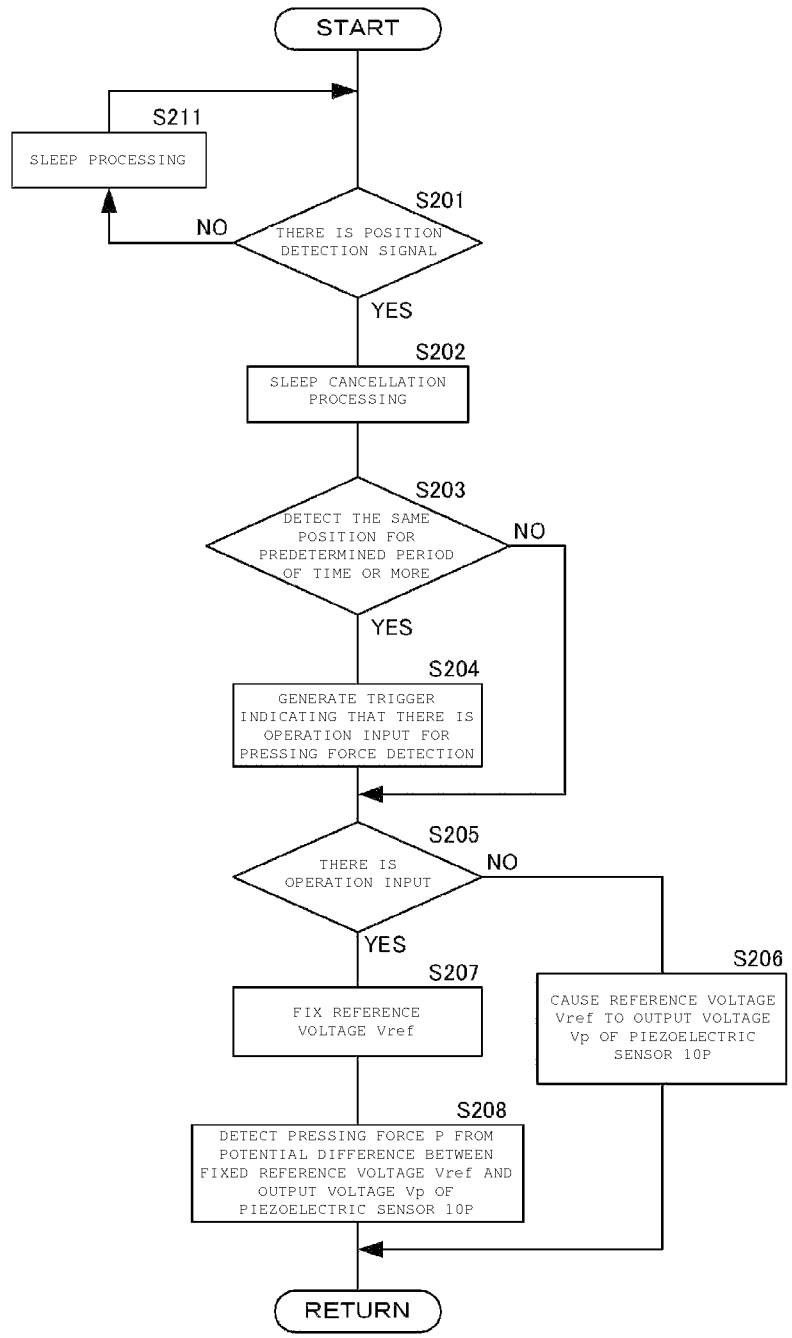
FIG. 10 is a flowchart illustrating a processing flow of a pressing force detection unit 3 according to a second embodiment.

Subsequently, a touch type operation input device according to the second embodiment will be explained with reference to drawings. The touch type operation input device according to the present embodiment has the same configuration as the touch type operation input device as shown in the first embodiment, but is different in the processing that is performed by the pressing force detection unit 3. Accordingly, only different portions will be explained. FIG. 10 is a flowchart illustrating processing flow of the pressing force detection unit 3 according to the second embodiment.

When the pressing force detection unit 3 cannot detect input of a position detection signal (S201: NO), a sleep mode (power saving mode) is set so as to stop the other functions while operating only the input detection function of the position detection signal (S211). When the pressing force detection unit 3 detects input of a position detection signal (S201: YES), all the functions of the pressing force detection unit 3 is activated, and the sleep mode is cancelled (S202). The pressed position on the touch surface of the touch sensor 10D can be detected from the position detection signal.

The pressing force detection unit 3 continues this processing, and when the pressing force detection unit 3 can detect the pressed position for a predetermined period of time equal to or more than a predetermined period of time that is set in advance (S203: YES), the pressing force detection unit 3 generates an operation trigger of the pressing force detection (S204). When the period of time for which the same pressed position is continuously detected is less than a predetermined period of time that is set in advance (S203: NO), the pressing force detection unit 3 does not generate the operation trigger of the pressing force detection.

When the pressing force detection unit 3 does not obtain the operation trigger of the pressing force detection, the pressing force detection unit 3 determines that no operation input is given (S205: NO), and the pressing force detection unit 3 causes the reference voltage Vref of the pressing force detection to follow the output voltage Vp of the piezoelectric sensor 10P (S206). In other words, the pressing force detection unit 3 constantly changes the reference voltage Vref so that the reference voltage Vref matches the output voltage Vp of the piezoelectric sensor 10P received.

When the pressing force detection unit 3 obtains the operation trigger of the pressing force detection, the pressing force detection unit 3 determines that an operation input is given (S205: YES), and fixes the reference voltage Vref of the pressing force detection (S207).

When the pressing force detection unit 3 fixes the reference voltage Vref, the pressing force detection unit 3 obtains the output voltage Vp of the piezoelectric sensor 10P. The pressing force detection unit 3 subtracts the reference voltage Vref from the output voltage Vp, thus calculating the pressing force detection voltage Vout. The pressing force detection unit 3 uses a relationship table or a relational expression between the pressing force detection voltage Vout and the pressing force P stored in advance to calculate the pressing force P from the pressing force detection voltage Vout thus calculated (S208).

By performing such processing, the function of the pressing force detection unit 3 is partially stopped until the position detection signal is obtained. The power saving can be achieved. Therefore, the touch type operation input device 10 consuming less electric power can be achieved.

Figure 11:
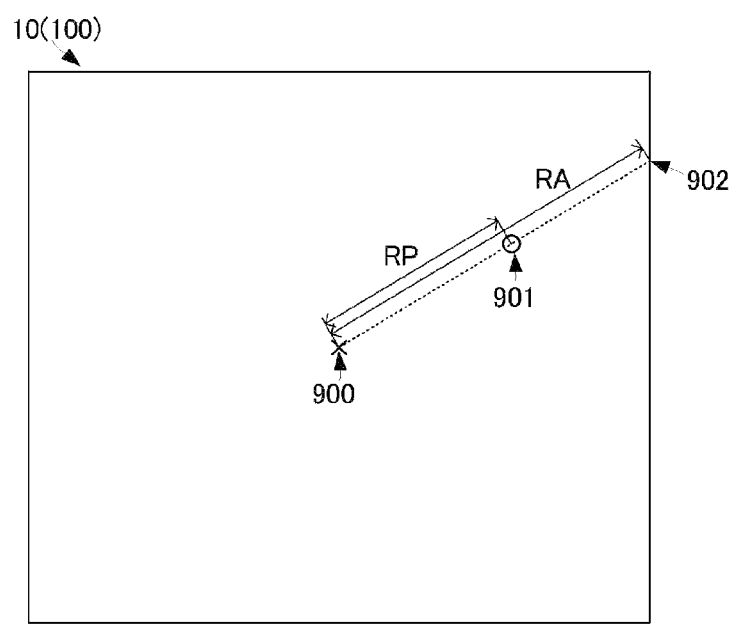
FIG. 11 is a view for explaining a concept of pressing force correction processing executed by a pressing force detection unit 3 according to a third embodiment.

Subsequently, the touch type operation input device according to the third embodiment will be explained with reference to drawings. The touch type operation input device according to the present embodiment has the same configuration as that of the touch type operation input device as shown in the first embodiment, and is different in the processing that is performed by the pressing force detection unit 3. Accordingly, only different portions will be explained. FIG. 11 is a view for explaining a concept of pressing force correction processing that is executed by the pressing force detection unit 3 according to the third embodiment.

The pressing force detection unit 3 calculates the pressing force P from the output voltage Vp of the piezoelectric sensor 10P, but since the piezoelectric film 100 of which end portions are fixed is used, the piezoelectric sensor 10P bends by a different amount in response to the pressing force P in accordance with the pressed position. For this reason, the output voltage Vp in response to the pressing force P is different. In other words, the sensitivity of the output voltage Vp in response to the pressing force P is different. More specifically, when the pressing force P is the same, the piezoelectric sensor 10P bends more greatly in the center, and accordingly, the output voltage Vp increases.

Therefore, when the pressing force detection unit 3 according to the present embodiment detects the pressed position on the basis of the position detection signal given by the touch sensor 10D, the pressing force P is calculated using the correction coefficient in accordance with the pressed position. At this occasion, the correction coefficient is configured to be dependent upon a distance RP from a center 900 to a pressed position 901 on the touch panel 10 (piezoelectric film 100). More specifically, for example, the correction coefficient will be set as follows.

The crossing point between a line connecting the center 900 and the pressed position 901 of the piezoelectric film 100 and a line constituting the end surface of the piezoelectric film 100 will be denoted as a crossing point 902. The distance between the center 900 and the crossing point 902 will be denoted as RA. The distance from the center 900 to the pressed position 901 of the touch panel 10 (piezoelectric film 100) will be denoted as RP explained above. In such configuration, the correction coefficient is given by a function dependent upon RP/RA. For example, the correction coefficient is configured to be a larger value when the value of RP/RA increases, i.e., the pressed position 901 is farther from the center 900. In other words, the sensitivity is configured to be higher as the value of RP/RA increases, i.e., the pressed position 901 is farther from the center 900.

The pressing force detection unit 3 multiplies the pressing force detection voltage Vout by the correction coefficient configured as described above. Accordingly, the calculation error of the pressing force P due to the difference of the pressed position can be suppressed. It should be noted that in this case, the pressing force detection voltage Vout is multiplied by the correction coefficient, but the pressing force P calculated according to the method explained above from the pressing force detection voltage Vout may be multiplied by the correction coefficient.

DESCRIPTION OF REFERENCE SYMBOLS

1: touch type operation input device,
2A: piezoelectric sensor driving voltage application unit,
2B: touch sensor driving voltage application unit,
3: pressing force detection unit,
10: touch panel,
10P: piezoelectric sensor,
10D: touch sensor,
30, 40: protection layer,
50: elastic body,
100: piezoelectric film,
100ST: first principal surface, 100sb: second principal surface,
11A, 11B, 11C, 11D, 11E, 11F: first line-shaped electrode,
21A, 21B, 21C, 21D, 21E, 21F: second line-shaped electrode,
13A, 13B, 13C, 13D, 13E, 13F, 13G, 13H, 13I, 13J, 13K, 13L, 131A, 132A, 131B, 132B, 131C, 132C, 131D, 132D, 131E, 132E, 131H, 132H, 131I, 1321, 131J, 132J, 131K, 132, K, 131L, 132L: third line-shaped electrode,
23A, 23B, 23C, 23D, 23E, 23F, 23G, 23H, 23I, 23J, 23K, 23L, 231A, 232A, 231B, 232B, 231C, 232C, 231D, 232D, 231E, 232E, 231H, 232H, 231I, 2321, 231J, 232J, 231K, 232K, 231L, 232L: fourth line-shaped electrode,
12A TO 12F, 14, 22A TO 22F, 24, 141, 142, 143, 144, 241, 242, 243, 244: routing electrode,
111, 211: wide width portion,
112, 212: narrow width portion,
113, 213: wide width portion for end portion
AR1: first partial area,
AR2: second partial area,
AR3: third partial area,
AR4: fourth partial area

The invention claimed is:
1. A touch type operation input device comprising:
an elastic body;

a piezoelectric sensor arranged on a first surface of the elastic body so as to extend across a center of the elastic body and extend along a length and a width of the elastic body from the center, and configured to generate an output voltage in accordance with a pressing force;

a support body supporting an end portion of the elastic body such that the piezoelectric sensor bends greater at a center thereof than at an edge thereof with the application of the pressing force;

a touch sensor configured to detect an operation input; and a pressing force detection unit configured to detect pressing force on the basis of the output voltage of the piezoelectric sensor, and to cause a reference voltage to follow the output voltage of the piezoelectric sensor, wherein when the pressing force detection unit obtains a detection result indicating that the operation input on the basis of a position detection signal from the touch sensor is above a predetermined value, the pressing force detection unit fixes the reference voltage to be the same as the output voltage at a time when the operation input is detected or to be the same as the output voltage at a time immediately before the operation input was detected, and detects the pressing force from a difference between the output voltage and the reference voltage, wherein when the position detection signal indicating a pressed position from the touch sensor is the same for a predetermined period of time or more, the pressing force detection unit determines to have obtained the detection result indicating that the operation input is above the predetermined value even if the pressing force is below the predetermined value, wherein when the position detection signal indicating the pressed position from the touch sensor is less than the predetermined period of time, the pressing force detection unit continues to monitor the position detection signal, and wherein the pressing force detection unit performs a correction to multiply the output voltage by a correction coefficient RP/RA such that a sensitivity of the piezoelectric sensor increases as a value of the correction coefficient RP/RA increases, where RA is a first distance between the center of the piezoelectric sensor and an end surface of the piezoelectric sensor passing through the pressed position, and RP is a second distance between the center of the piezoelectric sensor to the pressed position.

2. The touch type operation input device according to claim 1, wherein when the pressing force detection unit fails to obtain the detection result indicating that the operation input on the basis of the position detection signal from the touch sensor is above the predetermined value, the pressing force detection unit causes the reference voltage to be the same as the output voltage of the piezoelectric sensor.

3. The touch type operation input device according to claim 2, wherein when the pressing force detection unit does not detect the position detection signal indicating a pressed position from the touch sensor, the pressing force detection unit stops the pressing force detection.

4. The touch type operation input device according to claim 3, wherein when the pressing force detection unit detects the position detection signal indicating the pressed position from the touch sensor, the pressing force detection unit starts pressing force detection.

5. The touch type operation input device according to claim 1, wherein the pressing force detection unit corrects the pressing force detected from the output voltage in accordance with a pressed position on a touch surface indicated by the position detection signal from the touch sensor.

6. The touch type operation input device according to claim 1, wherein the touch sensor and the piezoelectric sensor include:

a flat film-shaped piezoelectric film including a first principal surface and a second principal surface facing each other;

an electrostatic capacitance detection electrode on at least one of the first principal surface and the second principal surface of the piezoelectric film; and a piezoelectric voltage detection electrode on the first principal surface and the second principal surface of the piezoelectric film.

7. A touch type operation input device according to claim 6, wherein the piezoelectric film is polylactic acid which had been subjected to stretching processing in at least one axis direction.

* * * * *